United States Patent [19]

Noel

[11] Patent Number: 4,494,164
[45] Date of Patent: Jan. 15, 1985

[54] OVERLOAD PROTECTION DEVICE
[75] Inventor: Stan L. Noel, Belmont, Calif.
[73] Assignee: Ampex Corporation, Redwood City, Calif.
[21] Appl. No.: 364,729
[22] Filed: Apr. 2, 1982
[51] Int. Cl.³ .............................................. H02H 9/02
[52] U.S. Cl. ..................................... 361/101; 361/93; 330/207 P; 330/298
[58] Field of Search ................... 361/91, 93, 100, 101, 361/56, 57, 16; 330/298, 207 P

[56] References Cited
U.S. PATENT DOCUMENTS

| | | | |
|---|---|---|---|
| 3,255,382 | 6/1966 | Wolf | 361/16 |
| 3,579,036 | 5/1971 | McCoy | 361/57 |
| 3,792,289 | 2/1974 | Kazem | 361/100 X |
| 3,932,789 | 1/1976 | Sons et al. | 361/31 |
| 4,156,885 | 5/1979 | Baker et al. | 361/100 |
| 4,173,739 | 11/1979 | Yoshida | 361/93 X |
| 4,354,217 | 10/1982 | Mahon | 361/101 X |

Primary Examiner—Reinhard J. Eisenzopf
Attorney, Agent, or Firm—Harry G. Thibault; Joel D. Talcott

[57] ABSTRACT

The output of an amplifier for driving capacitive loads is protected from short circuits or other fault conditions without need for mechanical circuits interruptive devices.

11 Claims, 2 Drawing Figures

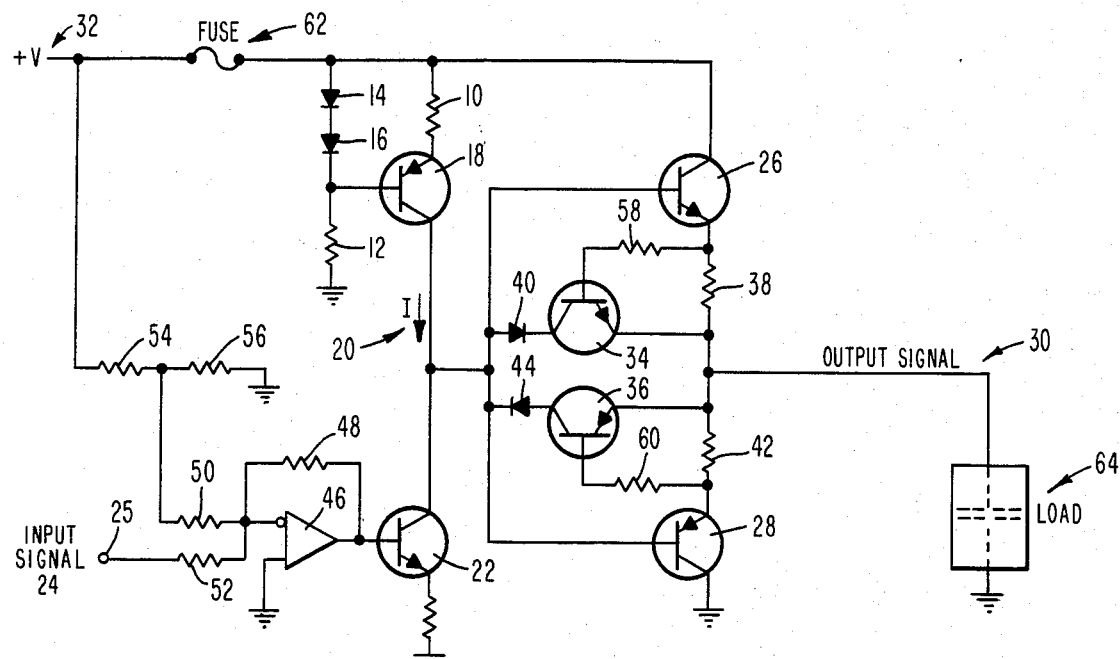
FIG_1
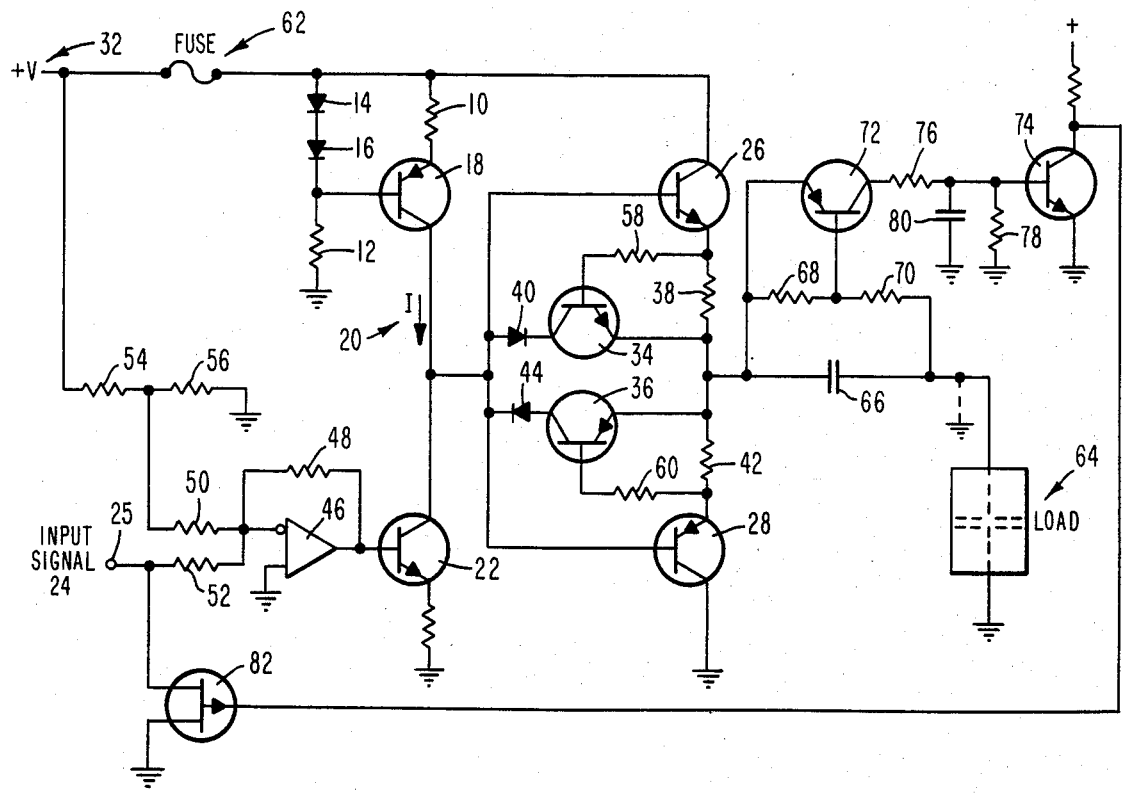
FIG_2

OVERLOAD PROTECTION DEVICE

BACKGROUND OF INVENTION

This invention relates to overload protection, and more particularly to the protection of an output amplifier driving capacitive loads from damage which may be caused by current demands in excess of acceptable amounts.

Output amplifiers find wide applications in supplying output signals with appropriate characteristics to drive loads, in response to input signals which are otherwise inappropriate to drive such loads. In particular, output amplifiers are used to generate appropriate output signals in response to a given input signal with substantially different voltage, current, or impedance characteristics. This frequently results in the generation of an output signal representing a greater amount of energy than was present in the input signal.

In dealing with output signals having large voltage or current levels, short circuits existing on the load can result in a number of serious consequences.

Short circuits can place additional current or voltage demands upon the various components associated with the generation of the output signal. This can lead to the damage or ultimate destruction of the various components through such factors as excessive heat generation, or internal breakdown within the device. In addition to the demands placed upon the individual components, short circuits may simultaneously subject the system power supply to demands beyond which it was intended to operate, resulting in failures of a similar nature.

In addition to the undesirable consequences to which short circuits subject the various components comprising the output amplifier circuitry, such conditions can also simultaneously have undesirable effects on the condition responsible for the improper load. One example of this is inadvertent human intervention wherein a human being has unintentionally become a part of the load to which the output amplifier is supplying substantial voltage or current, such as by touching an exposed conductor with a screwdriver during a component adjustment, resulting in a potentially serious shock hazard.

For the above reasons, various protection schemes have been employed to guard and protect against improper load conditions on the output of an output amplifier. These schemes generally fall into one of two catagories: limiting the current or voltage supplied, or complete shut-down of the output amplifier.

In those schemes directed to limiting the voltage or current present on the output signal, generally the limiting mechanism acts to limit the voltage or current to a specified value. However, this specified level is generally the maximum level which the output amplifier is capable of delivering under normal operating conditions.

This situation results from the fact that if the limiting circuit of the output amplifier were designed to act at a level lower than the maximum level necessary to drive the load, the limiting circuit would prevent the output amplifier from delivering the necessary maximum level to the load. Consequently, limiting circuitry normally associated with an output amplifier generally acts to limit the quantity of interest, e.g., voltage or current, to the predetermined maximum level.

There is necessarily associated with such limiting action component stress. This stress may result in heat build up or other undesirable conditions internal to the components comprising the output amplifier. However, component stress is not necessarily limited to those components associated with only the output amplifier circuit; to the contrary, component stress may also extend to the power supply components as well. Additionally, limiting at such a level will not likely protect against shock hazard problems.

In an alternate approach, an improper operating condition results in a complete shut down of the output amplifier. In such an arrangement, a fuse or similar electromechanical protection device is often employed. Such a device is frequently placed in series with the power supply and the output amplifier. An improper load condition will then result in the complete interruption of the operation of the output amplifier. While such an approach is a solution, it does have a number of disadvantages, including requiring a finite amount of time before corrective action is effective. Perhaps the most troublesome aspect in such an approach is the necessity of operator intervention, either in resetting a circuit breaker, or having to physically effect fuse replacement. From a practical standpoint, this is often further compounded by the problem of the fuse being inaccessible or a replacement fuse not being readily available.

One such example of the above discussed problems will illustrate the foregoing. In dealing with helical scan video recorders, the positionable magnetic heads are located within a rotating structure, known as a scanner, and require several driving potentials in excess of several hundred volts. Due to the limited amount of space, the positionable magnetic head assembly is somewhat inaccessible. Consequently when operator intervention becomes necessary, operator shock due to exposure to the high potential, as well as component failure and ultimately protective fuse replacement, frequently results. These are usually due to inadvertent shorts from hand tools or the operator himself coming into contact with the output of the output amplifier. In such a situation, an overload protection device to limit the hazards present would clearly be desirable.

SUMMARY OF INVENTION

In accordance with the present invention, the output of the amplifier is coupled to the load through a reactive device, the impedance of which (when compared to that of the load) is negligible at the frequency of operation. The potential difference across the impedance coupling device is monitored to detect the presence of excessive current, which results in the effective removal of the a. c. input signal from the amplifier.

It is, therefore an object of this invention to provide a simple yet effective means to sense the presence of a current in excess of a predetermined limit, and thereupon inhibit the a. c. input signal to the output amplifier.

It is a further object of this invention to reduce the current demands placed on a power supply as well as those placed on the component parts of an amplifier due to an overload condition on the output.

It is also an object of the invention to eliminate the necessity of a fuse in an output amplifier design.

It is also an object of this invention to reduce the potential shock hazard presented by the output of an output amplifier.

These and other objects, features and advantages of the present invention will become apparent by reference to the following description when read with the accompanying drawings.

BRIEF DESCRIPTION OF THE DRAWINGS

FIG. 1 is a schematic diagram of an output amplifier employing transistors configured in a complementary symmetry arrangement.

FIG. 2 is a schematic diagram of the output amplifier of FIG. 1 as modified in accordance with the present invention.

DETAILED DESCRIPTION

The circuit configuration of FIG. 1 will be used to illustrate and discuss the operation and functions of the preferred embodiment of the present invention, although other amplifier designs could be used in accordance with the present invention.

Resistors 10 and 12, diodes 14 and 16, and transistor 18 together form a source of constant current 20. Resistor 12 forward biases diodes 14 and 16 placing the base of transistor 18 at an essentially constant potential. Consequently the base to emitter junction of transistor 18 is forward biased, and the current 20, which is determined by the value of resistor 10, will be provided by said constant current source.

A transistor 22, in response to an input signal 24 applied to input terminal 25, will control the amount of current available to drive transistors 26 and 28 from that generated by the constant current source. This is accomplished by sinking to ground through transistor 22 in response to input signal 24, thereby reducing the amount of current 20 available to drive transistors 26 and 28.

Transistors 26 and 28 act in complementary symmetry to provide an output signal 30 with a maximum peak-to-peak value between the maximum supply voltage 32 and ground.

Transistors 34 and 36 function to limit the current passed by transistors 26 and 28 respectively. Resistor 38 is chosen such that the maximum expected current through transistor 26 produces a voltage drop across resistor 38 of an amount insufficient to forward bias the base to emitter junction of transistor 34. However, should an excessive amount of current flow through resistor 38, as would result from an improper load condition, the resulting potential drop across resistor 38 would be sufficient to forward bias the base to emitter junction of transistor 34, placing transistor 34 into conduction. With transistor 34 in a conducting state, a portion of the current drive is removed from the base of transistor 26 thereby reducing the current drive capability of transistor 26. Diode 40 functions to ensure that with transistor 34 in a conducting state, the base to emitter potential of transistor 26 remains sufficient for transistor 26 to remain in conduction thereby preventing a condition of oscillation in response to an overload condition.

In a similar fashion, resistor 42 is chosen such that the maximum expected current through transistor 28 produces a voltage drop insufficient to forward bias the base to emitter junction of transistor 36. However, should an excessive amount of current flow through resistor 42, as would result from an improper load condition, the resulting potential drop across resistor 42 would be sufficient to forward bias the base to emitter junction of transistor 36, placing transistor 36 into conduction. With transistor 36 placed in conduction, current drive is reduced from the base of transistor 28 thereby reducing the current drive capability of transistor 28. Diode 44 functions to ensure that with transistor 36 in a conducting state, the base to emitter potential of transistor 28 remains sufficient for transistor 28 to remain in a conducting state thereby preventing a condition of oscillation in reponse to an overload condition.

In normal operation, the circuit of FIG. 1 is used to amplify an a. c. input signal 24 applied to input terminal 25. Consequently, it is desirable to establish a d. c. quiescent operating voltage for the output signal 30 at a point approximately midway between ground and the supply voltage 32. This is accomplished by the application of a bias signal. Operational amplifier 46 is configured as a conventional inverting summing input amplifier. Resistor 48 is the feedback resistor and in conjunction with input resistors 50 and 52 sets the gain of the input amplifier to that desired for each of the two signals supplied to it.

Input signal 24 is supplied to input terminal 25 to one input of operational amplifier 46 through resistor 52, and constitutes the a. c. signal input to the output amplifier.

The second input to operational amplifier 46 supplied through resistor 50 serves to supply a bias to the output signal 30 of the output amplifier in such a manner as to place the quiescent operating point of the output amplifier at a value between the supply voltage 32 and ground. This is accomplished by supplying a fractional portion of the supply voltage 32 derived by resistive voltage divider composed of resistors 54 and 56 to the summing input of operational amplifier 46 through input resistor 50.

It will be observed that the current limiting provided by diode 40, resistors 38, 58, transistor 34 and diode 44, resistors 42, 60, and transistor 36 does not result in transistor 26 or transistor 28 being completely turned off in response to an overload condition. To the contrary, an equilibrium condition is established in response to a current demand in excess of the maximum expected. Considering transistor 26 and the current limiting circuit composed of diode 40, resistors 38 and 58 and transistor 34, it is observed that a steady state current will flow through resistor 38 which places transistor 34 in a conducting state, thereby sinking current from the base of transistor 26. However, transistor 26 will not be turned off. If transistor 26 were turned off, the current through transistor 26 would be zero, and the potential drop across resistor 38 would also be zero, resulting in transistor 34 also being turned off. To the contrary, current through transistor 26 is only limited to a predetermined value which by virtue of the necessity of the potential drop across resistor 38 is still in excess of the normal or expected maximum drive current to be supplied by the amplifier. The resulting condition will result in transistor 26 and transistor 28 passing a larger amount of current than is encountered in normal operation, with the resulting heat dissipation. This will persist as long as the condition existing on the output signal 30 requiring said excess current continues.

In addition to the adverse operating condition placed on output transistors 26 and 28 by an excess current demand, such a condition also places an additional sustained burden on the power supply.

The presence of an excessive current demand on output signal 30 such as is presented by a short circuit results in a condition wherein the circuit of FIG. 1 supplies not only a continuous quescient current, but also a current due to the a. c. input signal 24 imposed thereon. The corrective action provided by the circuit is to limit the current supplied to a maximum continuous amount, as determined by the respective potentials developed across resistors 38 and 42 due to the excessive current demand. Consequently, the circuit of FIG. 1, in response to a short on the output thereof, will supply a continuous current limited to a value approximately equal to the maximum current said circuit can supply.

FIG. 2 illustrates the preferred embodiment of the present invention used in connection with the output amplifier of FIG. 1 which is designated with the same reference numerals used therein.

Referring now to FIG. 2, it will be observed that the load 64 is represented as capacitive. The output of the output amplifier is coupled to load 64 by coupling capacitor 66. The capacitance value of coupling capacitor 66 is chosen such that the impedance presented to the current supplied by the output amplifier, at the expected frequency of operation, is negligible when compared to the impedance of load 64. Consequently, in normal operation, the potential difference present across coupling capacitor 66 would be negligible.

When the output amplifier is called upon to supply current at the frequency of operation in excess of that normally supplied, the potential difference across coupling capacitor 66 will necessarily increase, as will the potential difference across the voltage divider composed of resistors 68 and 70. Depending upon the values chosen for resistors 68 and 70, the presence of above nominal current will result in the base to emitter junction of transistor 72 becoming forward biased.

With the base to emitter junction of transistor 72 forward biased, a portion of the output current from the output amplifier will be supplied to the base of transistor 74. With transistor 72 placed in a conducting condition, a negligible voltage drop exists between its base and emitter. Resistors 76 and 78 function to place the base of transistor 74 at an appropriate potential to ensure that it will be forward biased, while at the same time supplying sufficient base current to drive transistor 74 into saturation. Capacitor 80 functions to provide filtering of any a. c. component which may be present on the base drive to transistor 74.

With transistor 74 driven into saturation, the collector of said transistor will be close to ground potential, which places a field effect transistor 82 in a conducting state. Field effect transistor 82 is placed between input terminal 25 and ground. With field effect transistor 82 in a conducting state, the input to the output amplifier is placed at ground potential. This condition will continue as long as a short circuit or other condition requiring excessive current remains on the output and eliminates any a. c. input from reaching the amplifier.

Upon correction of the short circuit on the output, the potential previously developed across capacitor 66 will decay to zero. This will result in the base-to-emitter potential of transistor 72 likewise decaying, and transistor 72 switching from a conducting to a non-conducting state. With transistor 72 in a non-conducting state, transistor 74 will switch to a non-conducting state, which results in field effect transistor 82 switching to a non-conducting state. Consequently, the ground condition previously existing on the input to the output amplifier will be removed, effectively once again applying input signal 24 to the input of the output amplifier.

It is observed that the invention above described operates to sense the presence of a condition on the load requiring excessive current from the output amplifier, in an amount of time limited only by the parameters of the associated circuit. In response to such a condition, it is observed that the invention removes the a. c. component from the output signal by removing the input signal to the output amplifier. It will also be observed that the maximum d. c. current which will be available from the output amplifier will be limited by the total resistance presented by the series combination of resistors 68 and 70.

The present invention is also insensitive to transient current conditions, as the coupling capacitor associated with the output will present a relatively low impedance to same.

Consequently, the present invention, in response to a short or other condition on the output condition on the load requiring an excessive current, will immediately remove the a. c. component from the output signal, and greatly limit the d. c. current. Upon correction of the condition on the output requiring excessive current, the present invention operates to automatically return the operation of the output amplifier to its normal state.

It is further observed that a fuse, circuit breaker or other circuit interruption means could be used in conjunction with the present invention as a back-up measure.

While the present invention has been particularly described in terms of the foregoing preferred embodiment, it is not intended to be limited thereby. Rather, the present invention is only to be limited, as set forth in the following claims.

What is claimed is:

1. Apparatus for sensing and limiting a. c. current to a reactive load from a signal source receiving an input signal comprising:
    reactive impedance means for coupling a. c. current from the signal source to the reactive load, wherein a potential difference is developed across said reactive impedance means in response to said a. c. current;
    switching means, responsive to the potential difference across said reactive impedance means, for switching from a first state to a second state in response to the potential difference being in excess of a preselected amount, and switching back to said first state in response to the potential difference being less than said preselected amount;
    control means responsive to the state of said switching means for connecting the input signal to the signal source when the switching means is in said first state, and for removing the input signal from the signal source when the switching means is in said second state.

2. Apparatus as in claim 1, wherein the impedance of said impedance means is much less than the impedance of the reactive load at the frequency of the input signal.

3. Apparatus for sensing the presence of a. c. current in excess of a preselected amount in response to a fault where the current is generated by a signal source to a load in response to an excitation signal and for removing the excitation signal from the source in response to the fault, the apparatus comprising:
    reactive impedance means, connected in series between the source and the load, for coupling the a. c. current from the signal source to the load;
    voltage divider means connected in parallel with said impedance means for developing a fractional portion of the potential difference across said impedance means; and switching means, responsive to said fractional portion of the potential difference, for removing the excitation signal from the source when the fractional portion is greater than a reference potential, and for applying said excitation signal to the source when the fractional portion is less than a reference potential.

4. A method for coupling and limiting a. c. signal current to a reactive load from an amplifier driven by an input signal; comprising:
reactively coupling the a.c. signal current from the amplifier to the load;
sensing the potential difference across said reactive coupling of the signal current from the amplifier to the load; and,
removing the input signal from the amplifier in response to a predefined potential difference across said reactive coupling.

5. Apparatus for sensing and limiting current to a reactive load from an amplifier driven by an input signal comprising:
coupling means for reactively coupling a. c. current from said output amplifier to the load;
detecting means responsive to the change in the relative difference between the reactance of said coupling means and the reactance of said load for detecting a. c. current in excess of a predefined amount; and
means responsive to said detecting means for removing the input signal from the amplifier when the a. c. current is in excess of the predefined amount and for applying the input signal to the amplifier when the a. c. current is not in excess of the predefined amount.

6. Apparatus, as recited in claim 5, wherein said detecting means further comprises:
a first switching means for switching from a first state wherein the input signal is connected to the amplifier to a second state wherein the input signal is disconnected from the amplifier when said current is in excess of the predefined amount, and for switching from said second state to said first state when said current is not in excess of the predefined amount.

7. Apparatus, as recited in claim 8, further comprises:
impedance means for controling said first switching means and connected across said coupling means so that current in excess of the predefined amount will result in said switching means changing state to the second state.

8. Apparatus, as recited in claim 6, wherein said first switching means comprises;
a transistor.

9. Apparatus as recited in claim 5 wherein said means for removing further comprises;
a second switching means having two states, responsive to said first switching means, so that in the first state said second switching means removes the input signal from the output amplifier, and in the second state applies the input signal to the amplifier.

10. Apparatus, as recited in claim 5, wherein said detecting means comprises:
resistive means connected across said coupling means for developing a signal representative of the relative difference between the reactance of said coupling means and the reactance of said load; and
switching means responsive to said relative difference signal for switching from a first state indicative of said relative difference being great to a second state indicative of said relative difference being small.

11. Apparatus for sensing and limiting current to a reactive load from an amplifier driven by an input signal comprising:
coupling means for reactively coupling a. c. current from said amplifier to the load;
a first resistor having a first and second terminal with said first terminal electrically connected to the amplifier;
a second resistor having a first and a second terminal with said first terminal connected to the second terminal of said first resistor, and the second terminal of said second resistor electrically connected to the load;
a first switching means having a control terminal connected to said first terminal of said second resistor for switching from a first state to a second state and for switching from said second state back to said first state in response to the voltage on said control terminal; and
means, responsive to said first switching means, for removing the input signal from the amplifier in response to said second state indicating the presence of a. c. current through said coupling means in excess of a predefined amount and for applying the input signal to the amplifier in response to said first state indicating the presence of a. c. current through said coupling means not in excess of the predefined amount.

* * * * *